United States Patent [19]
Zettler et al.

[11] Patent Number: 6,034,902
[45] Date of Patent: Mar. 7, 2000

[54] SOLID-STATE MEMORY DEVICE

[75] Inventors: Thomas Zettler, Munich; Wolfgang Pockrandt, Reichertshausen; Josef Winnerl, Munich; Georg Georgakos, Fraunberg, all of Germany

[73] Assignee: Siemens Aktiengesellschaft, Munich, Germany

[21] Appl. No.: 09/155,630

[22] PCT Filed: Mar. 24, 1997

[86] PCT No.: PCT/DE97/00597
  § 371 Date: Feb. 25, 1999
  § 102(e) Date: Feb. 25, 1999

[87] PCT Pub. No.: WO97/37352
  PCT Pub. Date: Oct. 9, 1997

[30] Foreign Application Priority Data

Mar. 28, 1996 [DE] Germany ............... 196 12 439

[51] Int. Cl.⁷ .................................... G11C 7/00
[52] U.S. Cl. ............ 365/195; 365/185.22; 365/189.07; 365/230.03
[58] Field of Search .............. 365/195, 230.03, 365/230.06, 231, 185.22, 185.2, 185.23, 189.07

[56] References Cited

U.S. PATENT DOCUMENTS

| | | | |
|---|---|---|---|
| 4,974,208 | 11/1990 | Nakamura et al. | 365/228 |
| 5,155,829 | 10/1992 | Koo | 395/425 |
| 5,406,519 | 4/1995 | Ha | 365/195 |
| 5,452,431 | 9/1995 | Bournas | 395/442 |
| 5,875,131 | 2/1999 | Shyu | 365/230.06 |
| 5,923,586 | 7/1999 | Choi | 365/185.23 |

FOREIGN PATENT DOCUMENTS

| | | |
|---|---|---|
| 0 129 054 A1 | 12/1984 | European Pat. Off. . |
| 41 15 152 A1 | 11/1992 | Germany . |

*Primary Examiner*—Son T. Dinh
*Attorney, Agent, or Firm*—Herbert L. Lerner; Laurence A. Greenberg

[57] ABSTRACT

The invention relates to a semiconductor storage device with a large number of storage cells (3), arranged on a semiconductor substrate at intersections of bit lines and word lines, which, for programming with data contents, can be driven by means of a word-line drive circuit (4) and a bit-line drive circuit (5). Enable storage cells (12, 14), arranged along an enable bit line (9, 10, 13) and driveable by means of an enable bit-line drive circuit (11) which is arranged and can be driven separately and independently of the bit-line drive circuit (5), are assigned to the storage cells (3) of a word line and can have an enable value applied to them in order to enable the storage cells (3) of a predetermined word line.

10 Claims, 7 Drawing Sheets

SOLID-STATE MEMORY DEVICE

BACKGROUND OF THE INVENTION

FIELD OF THE INVENTION

The invention relates to a semiconductor storage device with a large number of storage cells, arranged on a semiconductor substrate at intersections of bit lines and word lines, which, for programming with data contents, can be driven by means of a word-line drive circuit and a bit-line drive circuit.

A semiconductor storage device of this type finds a preferred application in so-called smart cards, that is to say identity cards, credit cards, account cards and the like, which are equipped with an integrated circuit having a microprocessor. The producer of a smart card can equip the microprocessor with a permanently stored operating system which undertakes basic functions, for example procedures for comparing an externally input code with a stored code, and the like. Further to storing the operating system, the memories inside the smart card, which are assigned to the microprocessor, are also used for storing specific applications and parameters which, for example, are required for the security check and must in each case be kept secret. A smart card of this type can be employed for varied applications if, by the producer, a suitable operating system with associated programs is provided, specific suitable interfaces are provided and a memory or a storage area is reserved for one or more imported application programs. In this way, the card producer can provide the user of the smart card with a memory or storage area for programming an imported user program. In a user program, it is, for example, possible to establish special operations which run independently of the operating system and relate merely to the special data-processing operations of the user. With one smart card configuration which can be used in a particularly varied way, provision may furthermore be made for a plurality of different users to store their corresponding programs in the smart card independently of each other.

In each case, as with all security-critical data-processing systems which, for example, are used for processing data which are confidential or have monetary value, special protection must be provided against data manipulation or unauthorized data access. It must therefore be ensured that security-relevant data, which form a component of the operating system or of the individual user programs, are protected from unauthorized access. In the case of a credit card as an example of a smart card, which comprises an integrated circuit with a non-volatile memory (for example an EEPROM or a ROM) and a microprocessor, safeguarding from manipulation requires that a user program stored in the non-volatile memory does not have uncontrolled access to other user programs or operating-system routines, which are likewise held in the non-volatile memory.

The prevention of this type of access can be ensured by a security circuit for memory access supervision which has been disclosed, for example, in DE 41 15 152 A1 or U.S. Pat. No. 5,452,431.

In this regard, essentially three different measures are explained in DE 41 15 152 A1. In a first measure, the addresses, at which the user program starts in the storage area is stored in two auxiliary registers in the represented circuit, before execution of the user program stored in the EEPROM. During the program execution, continuous comparison is made between the current address-bus value and the first auxiliary register, and between the program counter value and the second auxiliary register. A first comparison is used to determine whether a user program is active. A second comparison is used to conclude whether a permissible address range for the user program is actually being employed. If a user program is active and is not operating in a permissible range, a reset signal is triggered in the microprocessor. This measure has the disadvantage that the circuit requires additional auxiliary registers and comparators for n bits, n representing the address-bus width. In a second measure, it is proposed to supervise the program counter and the address-bus value using an additionally provided monitoring processor with its own memory. As in the first measure, a reset signal is triggered if a user program accesses an unpermitted address range. This circuit has the disadvantage that an additional processor with memory is required. In a third measure, or circuit, each storage area to be protected separately has different most-significant address bits (block-select bits). Before execution of the user program stored in a PROM block, the block-select bits are stored in an auxiliary register. During the program execution, the most-significant current address-bus bits are stored continuously in a second auxiliary register and compared with the first auxiliary register. If the contents of the auxiliary registers are different, it is concluded that the active user program is addressing another program storage area in a manner which is not permitted. A reset signal is consequently triggered. This circuit has the disadvantage that, for a small number of bits (for example two bits), only a rigid and uniform relatively coarse block subdivision is possible (for example a quarter of the total memory). Furthermore, only a continuous storage area can be allocated to an imported program. The imported program with the greatest program-memory requirement therefore determines the block size for the other imported programs as well, so that the use of memory is overall unfavourable.

U.S. Pat. No. 5,452,431 discloses a security circuit for memory access supervision, in particular for application in smart cards, in which the storage area of the EEPROM is subdivided into a repertory region ZR and an application region ZA, as well as a public region ZT. The various storage areas ZR, ZA and ZP are driven separately by means of an address-control circuit, in such a way that respectively determined address ranges are assigned to the individual storage areas, and fixed address limits are predetermined. The commands for writing, reading and erasing the respective storage areas can be blocked or enabled by the address-control circuit in predetermined frameworks. The disadvantage of this circuit resides in the fact that the distribution of the memory is fixed with the production of the EEPROM and can no longer be altered by the user.

SUMMARY OF THE INVENTION

The object of the present invention is to provide a circuit which, by simple measures, ensures that an imported program can access only those storage areas which are expressly permitted for access, and which simultaneously allows flexible distribution of the permitted storage areas to various applications.

This object is achieved by a semiconductor storage device according to claim 1.

According to the invention, provision is made that enable storage cells, arranged along an enable bit line and driveable by means of an enable bit-line drive circuit which is arranged and can be driven separately and independently of the bit-line drive circuit, are assigned to the storage cells of a word line and can have an enable value applied to them in order to enable the storage cells of a predetermined word line.

The circuit according to the invention is based on a special arrangement of a semiconductor memory, which allows simple supervision of the memory accesses and, simultaneously, flexible distribution of the memory or the storage areas to various applications. In addition to the setting of a flexible memory size, the invention also provides the advantage of free absolute positioning of the allocated memory areas in the address space of the user programs, so as to allow optimum use of the memory capacity which, in particular for smart cards, is of only limited availability. The invention simul-taneously allows, with comparatively little additional outlay on circuitry, reliable protection from unauthorized data manipulation or unauthorized data access, it being possible to carry out supervision of the data memories, in addition to supervision of the program memory.

The basic principle of the invention is to expand the word lines of a programmable semiconductor memory by m bits which do not lie in the normal address space and which contain information regarding the access rights relating to the data stored in the normal word-line bits (page). In the case of a number of m bits for the enable-storage cells, it is possible for $2^m$ applications, that is to say program or data areas, to be implemented separately of one another.

In a preferred embodiment of the invention, provision may be made that the storage cells, arranged along the intersections of bit lines and word lines, and the enable storage cells, arranged along intersections of word lines and enable bit lines, are driven in common by means of a word-line driver circuit provided in the word-line drive circuit. In this case, it is furthermore possible for a common address-decoder circuit to be provided for addressing both the storage cells and the enable-storage cells.

The invention therefore relates to a specially structured memory, and thus not to a so-called standard memory, in which, in addition to normal cells, the storage cells presently referred to as enable cells are provided by the manufacturer, the enable storage cells being coupled to the usual word-line drivers; the word-line drivers and address decoders are therefore provided in common for the normal cells and the enable cells, which saves a considerable amount of area. The different driving of normal and enable cells takes place merely using different bit lines.

In a further refinement of the invention, provision may be made that a microprocessor circuit is provided for executing an operating-system program and at least one user program, which microprocessor circuit, on calling or executing an initialization program, outputs to the enable bit-line drive circuit a control signal by means of which a storage area of the semiconductor storage device, allocated to the user program, can be activated. The enable cells of the additionally provided enable bit lines are not addressed in normal fashion, but are set by an initialization circuit. In this case, the initialization may, for example, be arranged in such a way that it is possible only once when loading the operating system, and thereafter the reservation of the additional enable cells of the enable bits can no longer be changed. In the case of one additional enable bit per page, that is to say m=1, two storage areas can be separated, for example for two different user programs. The number of pages which a user program reserves is in this case arbitrarily selectable. Likewise, the positioning of the user program in the total storage area can be set flexibly, it being even possible for an interleaved distribution of the storage areas to take place.

Preferred developments of the invention are given by the subclaims.

Further features, advantages and expedient features of the invention are given from the description of illustrative embodiments with the aid of the appended drawing.

DESCRIPTION OF THE PREFERRED EMBODIMENTS

Figure 1A:
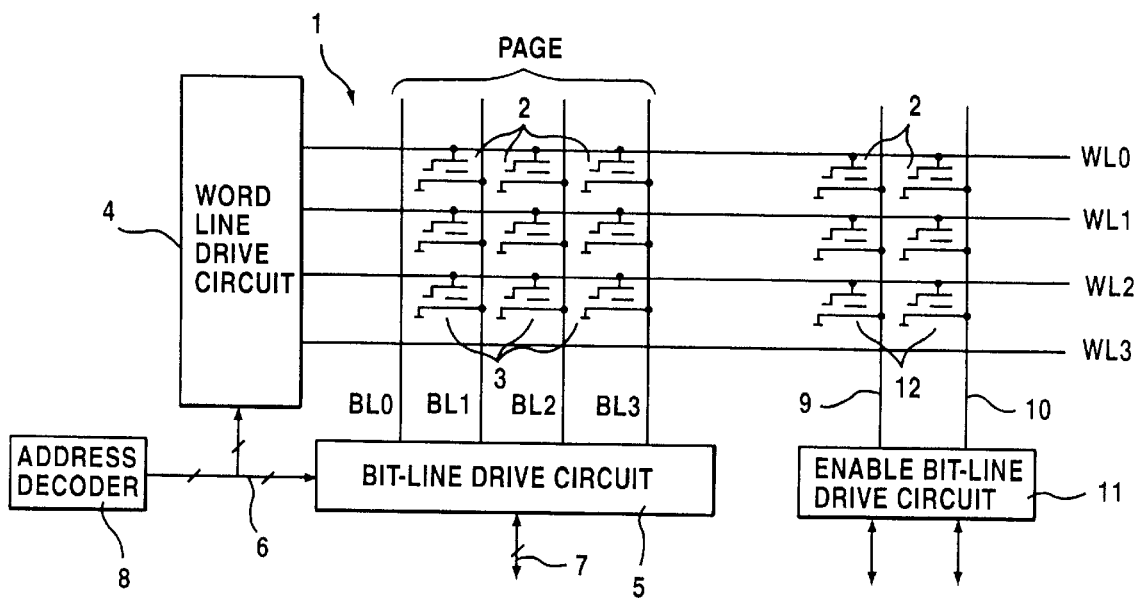
FIG. 1A shows a schematic representation of an electrically erasable and programmable semiconductor memory for explaining the basic mode of operation of the invention.

FIG. 1A shows the structure of an electrically alterable read-only memory 1 (EEPROM=Electrically Erasable Programmable ROM), the advantage of which, as is known, consists in the fact that the integrated circuit is erasable and reprogramable, without needing to be removed from the user device, and that each individual byte of the memory can be erased and written separately many times. Erasing takes place using an electrical pulse. The storage element used is cells 2 with a control electrode and a floating intermediate electrode, which acts as a charge store. The mode of operation of a read-only memory of this type is basically known and shall not be explained in further detail here. The normal storage cells 3 of the semiconductor storage device 1 are arranged in a large number at intersections of bit lines BL and word lines WL, and can be driven by means of a word-line drive circuit 4 and a bit-line drive circuit 5 in the manner which is familiar to the person skilled in the art. An address bus 6 and a data bus 7 are provided, on which the addresses or data are transported between the various circuit components. For the sake of clarity, only one line each is shown for the address bus 6 and the data bus 7, although a large number of lines, for example 16 lines, are actually provided. It is equally well possible for the bus system to consist of only one line, in which case the addresses and the data are processed using the time multiplex method. FIG. 1A represents only four word lines WL0 to WL3 of the generally very large number of word lines, and only four bit lines BL0 to BL3. The reference number 8 schematically denotes an address decoder, the structure and mode of operation of which is also familiar to the person skilled in the art and shall therefore not be explained in further detail.

Figure 1B:
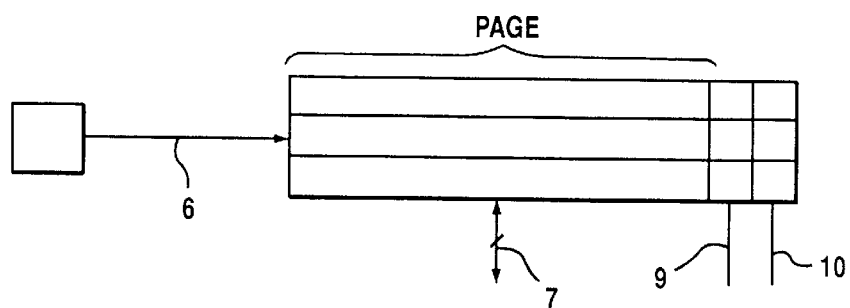
FIG. 1B shows a simplified block representation of the semiconductor memory according to the invention represented in FIG. 1A.

The security circuit according to the invention is based on a special arrangement or design of the memory 1 according to FIG. 1A and FIG. 1B, which allows simple supervision of the memory accesses and a flexible distribution of the memory 1 to various applications. The basic principle of the invention is the expansion of the memory word line by m bits, which do not lie in the normal address space, and which contain information regarding the access rights relating to the data stored in the normal word-line bits (pages). To this end, m additional bit lines 9 and 10 are provided, which are referred to hereafter as enable bit lines, and can be driven via an enable bit-line drive circuit 11 independently of the (normal) bit-line drive circuit 5. At the intersections of the (normal) word lines WL0 to WL3 and the additionally provided enable bit lines 9 and 10, enable storage cells 12 are provided, which need not be distinguished in terms of structure and mode of operation from the normal storage cells 3 and can therefore be produced together with the normal cells 3. Enable values are temporarily or permanently stored in the enable storage cells, in the manner which is yet to be explained below, and are used for enabling the (normal) storage cells 3 of one or more predetermined word lines WL0 to WL3.

Figure 2:
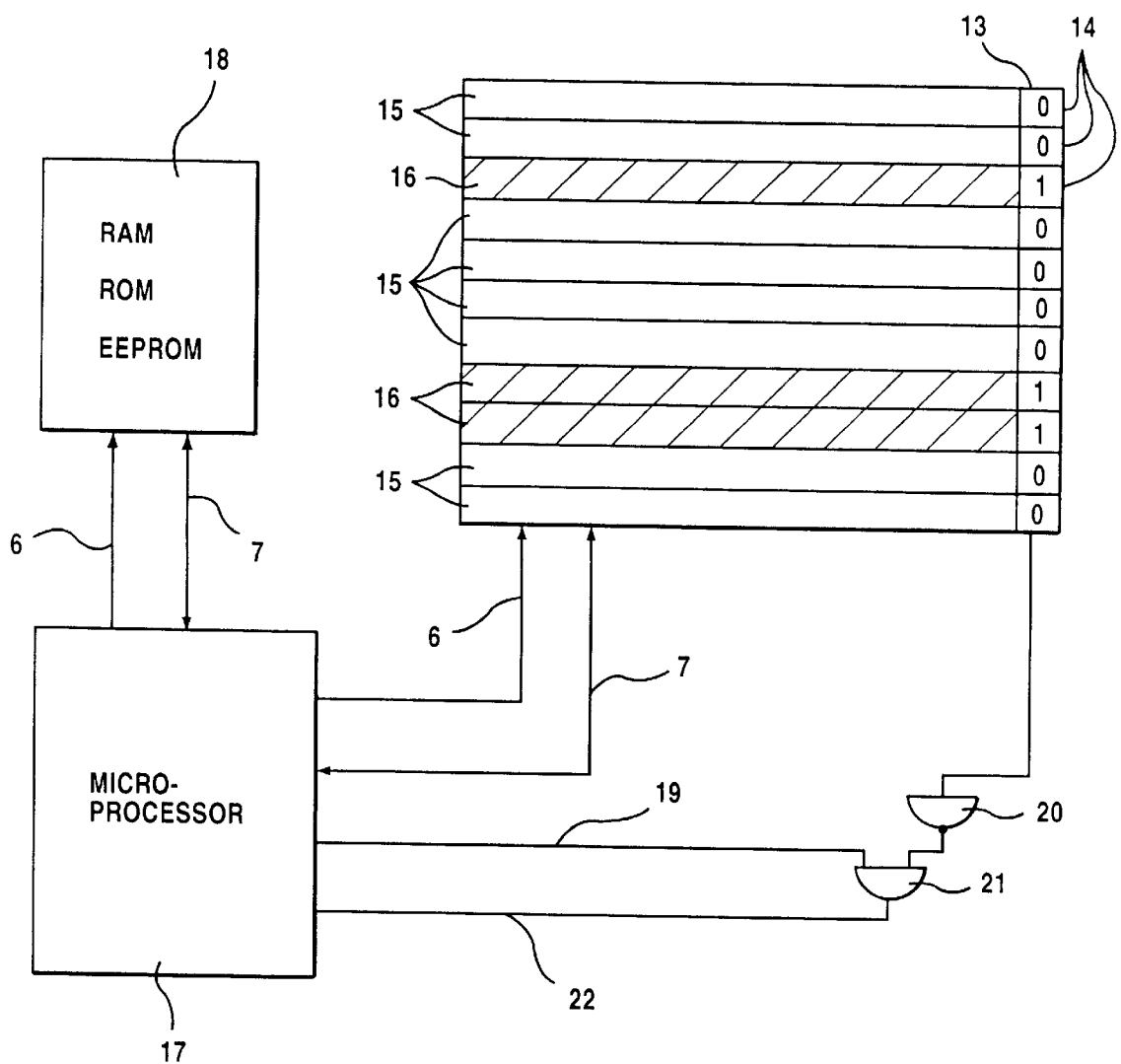
FIG. 2 shows a schematic representation of a circuit according to one illustrative embodiment of the invention.

FIG. 2 shows a first illustrative embodiment of the invention, in which a single enable bit line 13 is provided with enable storage cells 14, that is to say m=1. The data contents of the enable storage cells 14 of the one enable bit line 13 are not addressable as for the (normal) storage cells 3, but are set by an initialization circuit (not represented in further detail in the figures) provided in the enable bit-line drive circuit 11. The initialization may in this case, for example, be arranged in such a way that it is possible only once when loading the operating system. Thereafter, the reservation of the additional enable bits (1 bit per page) can no longer be changed. In the case of one bit per page (m=1), two storage areas 15 and 16 can be selected separately from each other, for example for two different user programs. The number of pages which a user program reserves is in this case arbitrarily selectable. Likewise, the positioning of the user programs in the total storage area is flexible, it even being possible for them to be distributed in interleaved storage areas. The storage area 15 is, for example, allocated by writing a logical zero in correspondingly assigned enable storage cells, while the storage area 16 is defined by writing a logic value 1.

Assigned to the semiconductor memory 1 is a microprocessor circuit 17 in which the operating system and the user programs are called or executed, and which is connected via the address bus 6 and the data bus 7 to further memories and registers, for example RAM, ROM or EEPROM memories, which are denoted together by the reference number 18 for the sake of simplicity. The operating system running in the microprocessor 17 has the highest hierarchy level, whereas user programs are subordinate. When calling a user program, a control signal is set by the microprocessor 17 and is applied to a line 19. This process can only be initiated by the operating system. In this way, the user program can be active only in the storage area allocated to it. The control signal of the microprocessor 17 therefore indicates whether a user program is active. Without further auxiliary registers, this control signal is compared in simple fashion with the current extra bit of the enable bit line 13. To this end, a comparator circuit with an inverter 20 and a AND gate 21 is provided, which are connected in the manner visible in FIG. 2. Intermediate storage of all or some of the address is not required. If a user program is active and accesses an unallowed address range, a reset signal is triggered on the line 22 in the microprocessor 17. It is, however, likewise possible not to reset the microprocessor with the control signal, but to trigger another suitable action.

Figure 3:
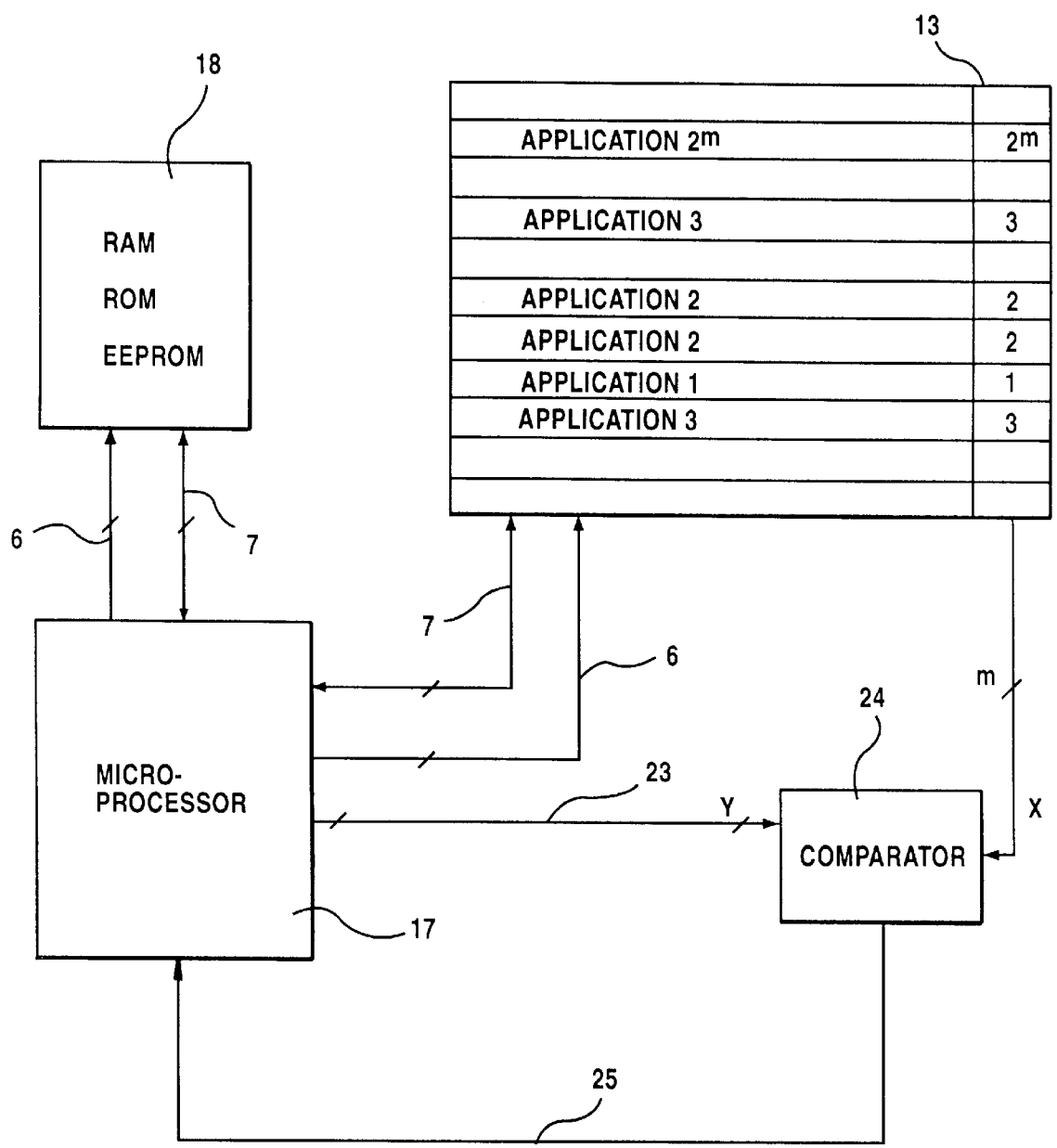
FIG. 3 shows a schematic representation of a circuit according to a further illustrative embodiment of the invention.

FIG. 3 shows a second illustrative embodiment of the invention, in which, in comparison with the first embodiment, m additional enable bit lines 13 are provided in a more general fashion.

As in the first illustrative embodiment, the m additional bits for word line WL0 to WL3 are not normally addressable, but are set by an initialization circuit. The initialization circuit for the additional bits of the enable bit lines can, for example, be integrated within the enable bit-line drive circuit 11 (see FIG. 1A). The initialization can in this case again be arranged in such a way that it is possible only a single time when loading the operating system, and thereafter reservation of the enable storage cells of the additional enable bit lines can no longer be changed. In the case of a number of m enable bit lines, $2^m$ program areas can be separated individually for user programs, the number of pages reserved by a user program being arbitrarily selectable, and it even being possible for the positioning of the user programs in the total storage area to be set flexibly, and in particular with an interleaved distribution of the storage areas. Again, the operating system has the highest hierarchy level, whereas user programs are subordinate. When calling a user program, a group of control signals, or a control-signal vector, is set on the line 23, which process can only be initiated by the operating system. In this way, the respective user program can only be active in the storage area allocated to it. The control-signal vector of the microprocessor 17 in this case indicates which of the maximum possible $2^m$ applications are active. Before the start of the respective application, the m-bit value Y assigned to the application is set. The value Y is compared for each memory access with the current additional enable bit content X, by means of a comparator 24. If Y is not equal to X, then there is an unallowed access, and as a reaction to this, a suitable control signal, for example a reset signal, is generated on the line 25 and resets the microprocessor 17.

Figure 4:
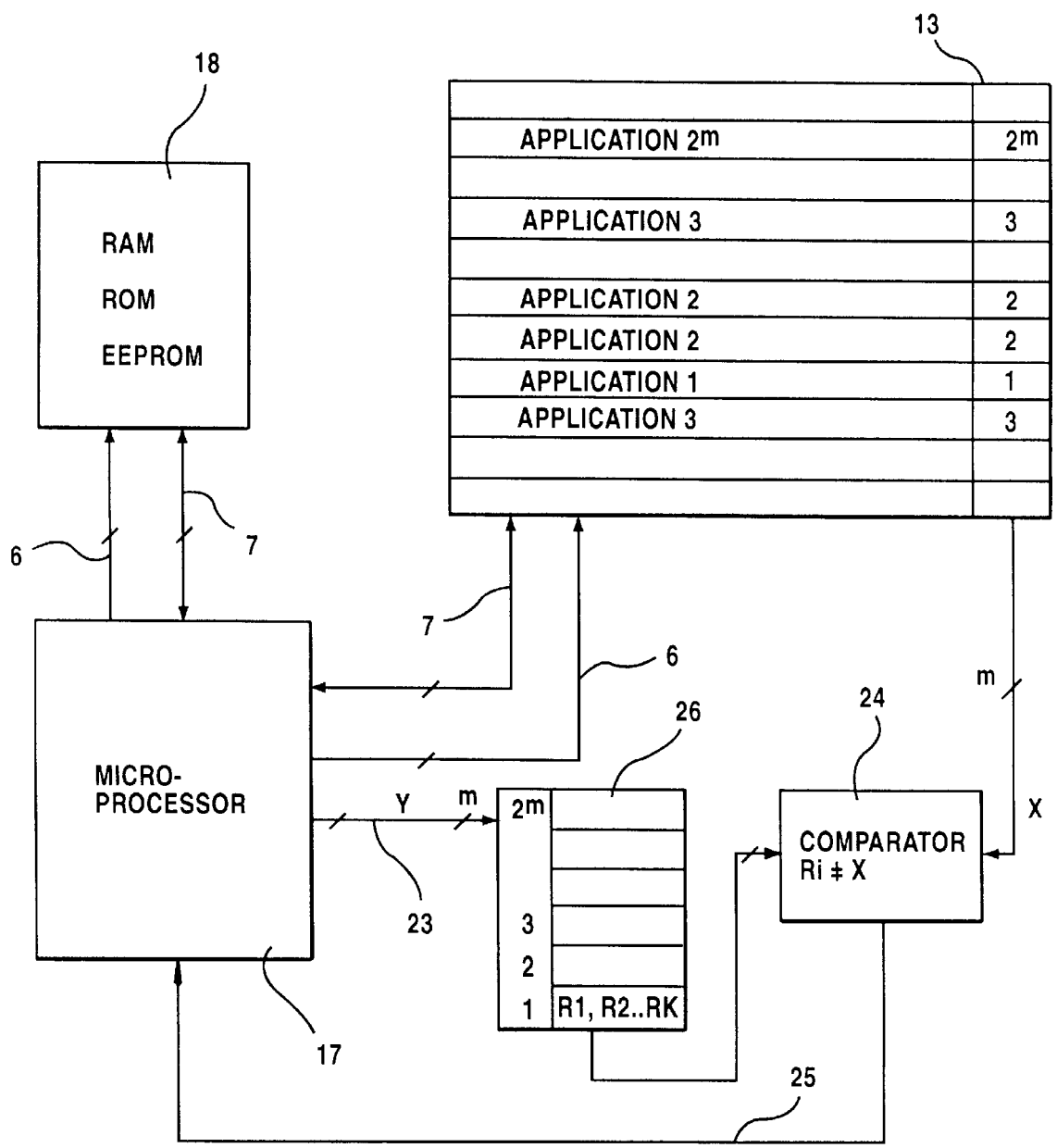
FIG. 4 shows a schematic representation of a circuit according to a further illustrative embodiment of the invention.

FIG. 4 shows a third illustrative embodiment of the invention, which is expanded in comparison with the second illustrative embodiment by an additional memory 26 the so-called access-right table memory. Again, the m additional enable bits per word line WL0 to WL3 are not addressable in the normal way, but are set by an initialization circuit. Furthermore, the reservation of the access-right table memory 26 is established in the initialization phase. The initialization circuit for the additional enable bits can, for example, again be designed as integrated within the enable bit-line drive circuit 11 (see FIG. 1A). The initialization can in this case likewise be arranged in such a way that it is possible only when loading the operating system. Thereafter, the reservation of the additional enable bits and the access-right table memory can no longer be changed. In the case of m additional enable bits, $2^m$ program areas can again be separated, the number of pages reserved by a user program being arbitrarily selectable, the positioning of the programs in the total storage area being flexible, and an interleaved distribution of the storage areas being again possible. The operating system has the highest hierarchy level, and user programs are subordinate. When calling a user program, a control signal is set, in the third illustrative embodiment according to FIG. 4, again a group of control signals or a control-signal vector. This process can only be initiated by the operating system, so that in this way the user program can be active only in the storage area allocated to it. The control-signal vector of the microprocessor 17 again indicates which of the maximum possible $2^m$ applications is active. Before the start of the application, the m-bit value Y assigned to the application is set. The value is decoded in the access-right table of the memory 26, which may be a separate memory, albeit with a smaller number of stores. The k entries R1, . . . , Rk assigned to the respective application Y are compared by means of the comparator 24 with the current additional enable-bit content X. If Ri is not equal to X for all Ri, then there is an unallowed access. As a reaction, a suitable control signal, for example a reset signal, is generated on the line 25. The introduction of the access-right table memory 26 allows arbitrary establishment of the mutual access rights of the applications. In this way, it is possible for one application A to be allowed to access an application B, but, for example, the application B not to be allowed to access the application A.

When calling user programs by the operating system, it must be ensured that the data-protecting processor-control signals are set in good time at the start of the application, and are erased again when the application is exited. This can be done, for example, in the following way: if the operating system sets the control signals before the jump to the user program, then the jump command is marked as part of the user program. Likewise, the microprocessor 17 can automatically recognize the jump command in the user-program area, and set the corresponding control signals.

Figure 5:
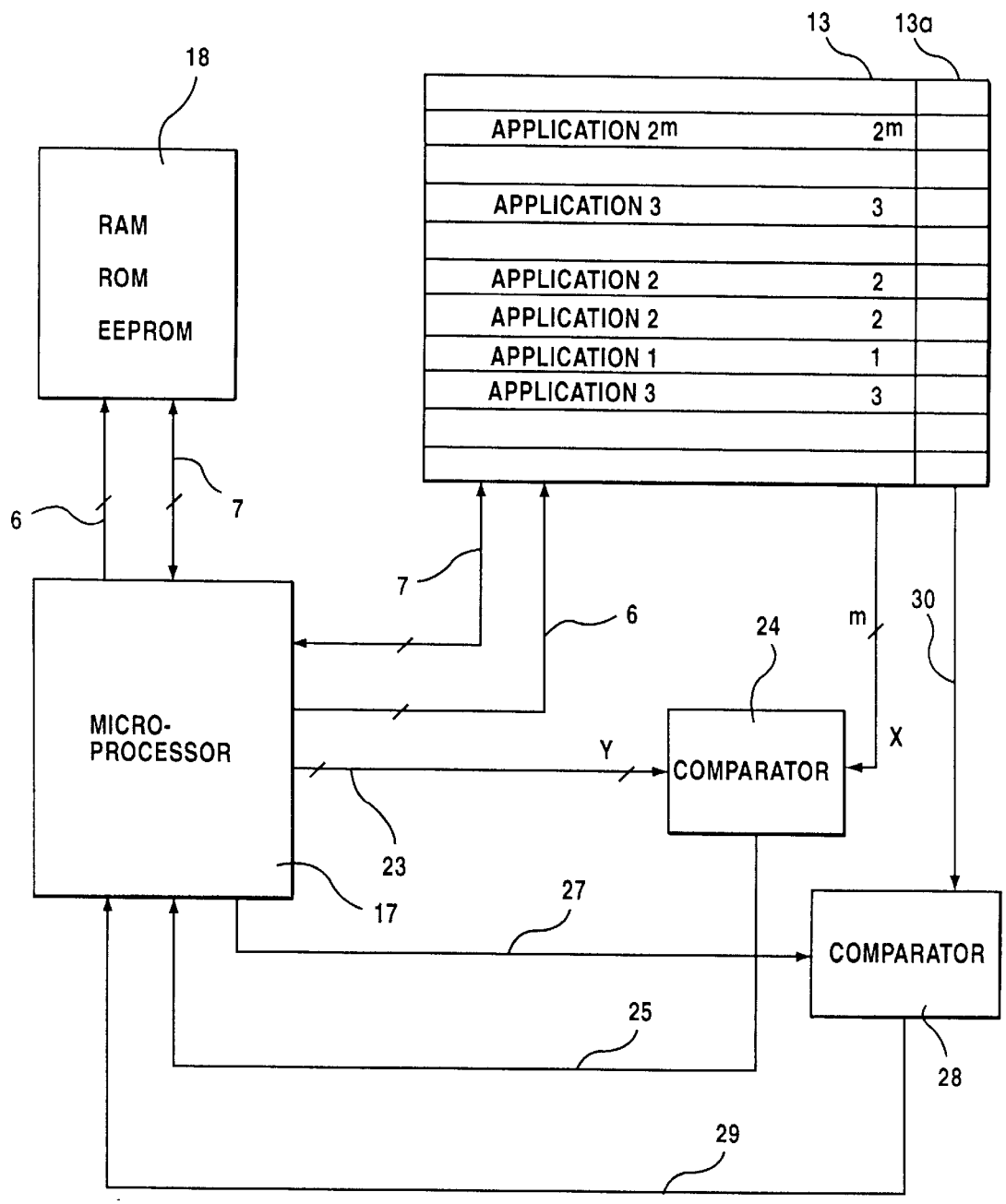
FIG. 5 shows a schematic representation of a circuit according to a further illustrative embodiment of the invention.

FIG. 5 shows a further illustrative embodiment of the invention, which allows establishment of the action rights of the user programs, such as, in particular, with regard to the actions of reading, writing and erasing. To this end, the semiconductor memory has a number n of additional enable bit lines 13a for establishing the possible actions, and a comparator 28 which is connected via a line to the additional n enable bit lines 13a and is in contact via lines 27 and 29 with the microprocessor 17. During initialization, setting the enable storage cells of the additional enable bit lines 13a establishes which actions a user program is allowed to execute, that is to say reading, writing or erasing in the respectively allotted storage area. In the event of violation by the user program of the action status, which is indicated or predetermined by the microprocessor 17 through the action-status signal applied to the line 27, a reset of the microprocessor 17 can, for example, be induced by the control signal output on the line 29 by the comparator 28.

Figure 6:
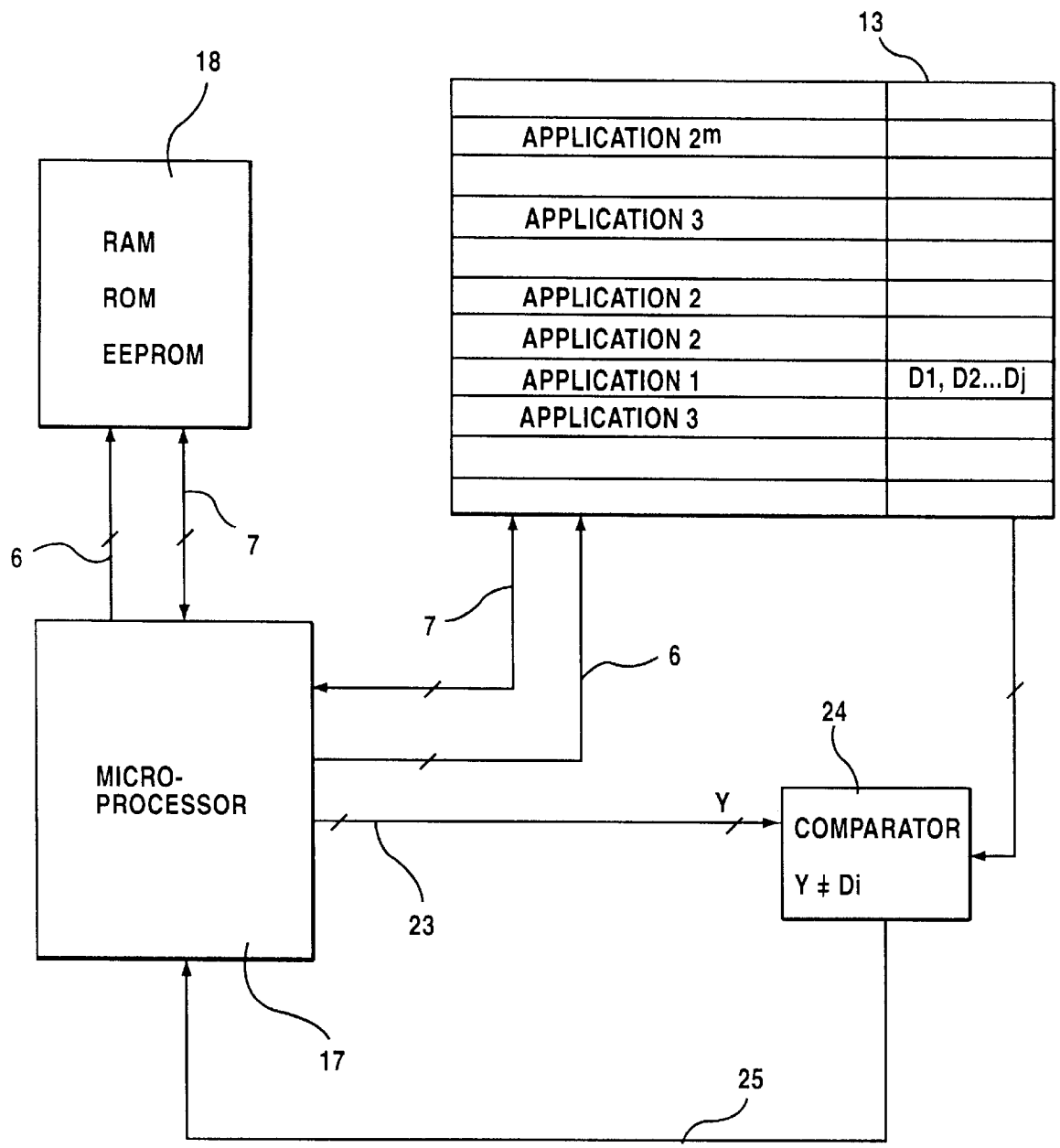
FIG. 6 shows a schematic representation of a circuit according to a further illustrative embodiment of the invention.

FIG. 6 shows a further illustrative embodiment of the invention, in which the access-right table 26 explained according to FIG. 4 is designed, with particularly simple circuit technology, as integrated equally into the enable storage cells of a number of k enable bit lines 13 (in this case, k is less than or equal to m).

Figure 7:
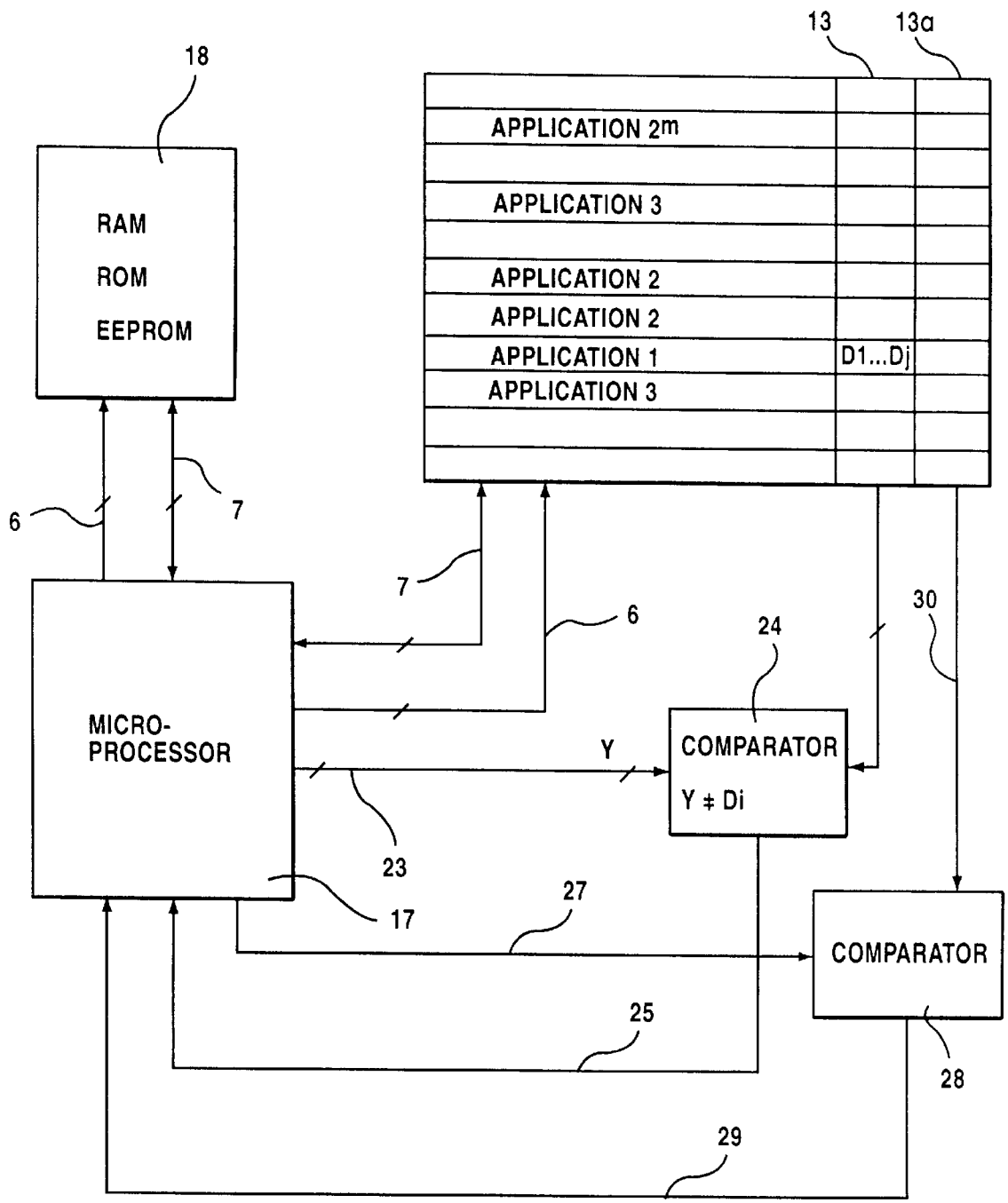
FIG. 7 shows a schematic representation of a circuit according to a further illustrative embodiment of the invention.

In the illustrative embodiment represented in FIG. 7, the advantageous features from the illustrative embodiments according to FIG. 5 and FIG. 6 are combined.

By virtue of the circuit according to the invention, it is possible to control the access to data-storage areas, in addition to establishing access rights for program-code areas.

What is claimed is:

1. A semiconductor storage device, comprising:
   a semiconductor substrate;
   bit lines disposed on said semiconductor substrate;
   word lines disposed on said semiconductor substrate;
   a plurality of storage cells having data contents and disposed on said semiconductor substrate at intersections of and connected to said bit lines and said word lines;
   a word-line drive circuit connected to said word lines and
   a bit-line drive circuit connected to said bit lines for driving and programming said data contents of said plurality of storage cells;
   enable bit lines;
   an enable bit-line drive circuit connected to and driving said enable bit lines separately and independently of said bit-line drive circuit;
   enable storage cells disposed along said enable bit lines and driveable by said enable bit-line drive circuit, said enable storage cells assigned to said plurality of storage cells of said word lines and having enable values for enabling said plurality of storage cells of a predetermined word line, an m number of said enable bit lines provided for selectably reserving a number of $2^m$ program regions of said plurality of storage cells;
   a microprocessor outputting a control signal having a value; and
   a comparator having a first input connected to said enable bit lines and receiving said enable values and a second input receiving said control signal from said microprocessor, said comparator generating a comparator output signal if said value of said control signal and said enable values are unequal.

2. The semiconductor storage device according to claim 1, including an access-right table memory connected to said comparator and to said microprocessor for storing an access right table for establishing access rights to said $2^m$ program regions.

3. The semiconductor storage device according to claim 2, wherein said access-right table is integrated within a number of k said enable bit lines.

4. The semiconductor storage device according to claim 1, wherein said enable storage cells are connected to said word lines, and said storage cells and said enable storage cells are driven in common by said word-line drive circuit.

5. The semiconductor storage device according to claim 1, including a common address-decoder circuit connected to said bit-line drive circuit and to said word line drive circuit for addressing both said plurality of storage cells and said enable storage cells.

6. The semiconductor storage device according to claim 1, wherein said enable bit-line drive circuit has an initialization circuit for establishing said enable values of said enable storage cells of a respective enable bit line.

7. The semiconductor storage device according to claim 1, wherein said microprocessor executes an operating system program and at least one user program, said microprocessor on one of calling and executing an initialization program emits said control signal to said enable bit-line drive circuit so that a storage area allocated to the at least one user program can be activated.

8. The semiconductor storage device according to claim 7, wherein said microprocessor, on one of calling and executing the at least one user program, applies said control signal via one or more control lines to said comparator connected to one or more of said enable bit lines, said comparator emits said comparator output signal to said microprocessor should the at least one user program commit one of an access-right violation, a read violation, a write violation and an erase violation.

9. The semiconductor storage device according to claim 8, wherein an n number of said enable bit lines are provided for enabling a reading action, a writing and an erasing action.

10. A chip card, comprising:
   a semiconductor storage device, including:
      bit lines disposed on said semiconductor substrate;
      word lines disposed on said semiconductor substrate;

a plurality of storage cells having data contents and disposed on said semiconductor substrate at intersections of and connected to said bit lines and said word lines;

a word-line drive circuit connected to said word lines and a bit-line drive circuit connected to said bit lines for driving and programming said data contents of said plurality of storage cells;

enable bit lines;

an enable bit-line drive circuit connected to and driving said enable bit lines separately and independently of said bit-line drive circuit;

enable storage cells disposed along said enable bit lines and driveable by said enable bit-line drive circuit, said enable storage cells assigned to said plurality of storage cells of said word lines and having enable values for enabling said plurality of storage cells of a predetermined word line, an m number of said enable bit lines provided for selectably reserving a number of $2^m$ program regions of said plurality of storage cells;

a microprocessor outputting a control signal having a value; and a comparator having a first input connected to said enable bit lines and receiving said enable values and a second input receiving the control signal from said microprocessor, said comparator generating a comparator output signal if said value of said control signal and said enable values are unequal.

* * * * *